United States Patent
Lin (10) Patent No.: US 8,300,370 B2
(45) Date of Patent: Oct. 30, 2012

(54) ESD PROTECTION CIRCUIT AND CIRCUITRY OF IC APPLYING THE ESD PROTECTION CIRCUIT

(75) Inventor: I-Cheng Lin, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 290 days.

(21) Appl. No.: 12/271,052

(22) Filed: Nov. 14, 2008

(65) Prior Publication Data

US 2010/0123984 A1    May 20, 2010

(51) Int. Cl.
*H02H 9/00* (2006.01)
(52) U.S. Cl. .......................................... 361/56
(58) Field of Classification Search ............... 361/56
See application file for complete search history.

(56) References Cited

U.S. PATENT DOCUMENTS

| | | | |
|---|---|---|---|
| 5,051,860 A | | 9/1991 | Lee et al. |
| 5,304,582 A | | 4/1994 | Ogawa |
| 5,426,323 A | * | 6/1995 | Reczek et al. ............. 257/360 |
| 5,561,312 A | * | 10/1996 | Nozoe et al. ............. 257/357 |
| 5,589,423 A | * | 12/1996 | White et al. ............. 438/586 |
| 5,637,900 A | * | 6/1997 | Ker et al. ............. 257/355 |
| 5,689,133 A | * | 11/1997 | Li et al. ............. 257/361 |
| 6,028,465 A | * | 2/2000 | So ............. 327/321 |
| 6,137,664 A | | 10/2000 | Casper et al. |
| 6,894,881 B1 | * | 5/2005 | Vashchenko et al. ........ 361/56 |
| 7,519,930 B2 | * | 4/2009 | Mori ............. 716/5 |
| 2004/0252427 A1 | * | 12/2004 | Tatehara et al. ............. 361/56 |
| 2005/0013073 A1 | * | 1/2005 | Cheng et al. ............. 361/56 |
| 2008/0242033 A1 | * | 10/2008 | Levin et al. ............. 438/286 |

* cited by examiner

*Primary Examiner* — Rexford Barnie
*Assistant Examiner* — Ann Hoang
(74) *Attorney, Agent, or Firm* — Thomas|Kayden (57) ABSTRACT

A circuitry of an IC is provided, including a pad, an internal circuit, and an ESD protection circuit. The pad transmits or receives a signal and is coupled to a first node. The internal circuit is coupled to the first node for processing the signal. The ESD protection circuit includes an ESD clamping circuit, a first current limiting and shunting unit and a second current limiting and shunting unit. The ESD clamping circuit is coupled to the first node, for clamping an ESD current flowing through the first node. The first current limiting and shunting unit is through the first node coupled to the pad, for limiting the ESD current and shunting part of the ESD current to a first voltage path. The second current limiting and shunting unit is coupled to the first current limiting and shunting unit, for limiting the ESD current and shunting part of the ESD current to a second voltage path.

9 Claims, 7 Drawing Sheets

ESD PROTECTION CIRCUIT AND CIRCUITRY OF IC APPLYING THE ESD PROTECTION CIRCUIT

BACKGROUND OF THE INVENTION

1. Field of the Invention

The invention relates to an electrostatic discharge (ESD) protection circuit, and in particular relates to an ESD protection circuit using diffusion resistors and parasitic diodes of the diffusion resistors.

2. Description of the Related Art

For semiconductor manufacturing process development, dimensions of complementary metal-oxide-semiconductor transistor (CMOS) have reached sub-micron level to upgrade the performance of very large scale integrated (VLSI) circuits and computational speed. As dimensions shrinks, reliability and ESD tolerance of VLSI circuits decline significantly.

ESD models include human-body model (HBM), machine model (MM), and charged-device model (CDM). All three generate instantaneous current of several amperes only for hundreds of or even several nanoseconds.

Due to the size of the VLSI circuit shrinking to a micrometer or nanometer, the VLSI circuits are easily damaged by electrostatic discharge (ESD) when the electrostatic discharge current exorbitantly exceeds the internal circuit limit. If the circuit line width of the VLSI circuit is increased, the VLSI circuit can tolerate or endure a much bigger ESD current but the size of the VLSI circuit increases. Additionally, increasing circuits in one chip would increase the chip size. An alternative way to avoid ESD damage in VLSI circuits is to prevent electrostatic discharge current from flowing through the internal circuits, wherein, limiting the electrostatic discharge current from flowing through the internal circuits is the focus of this invention.

BRIEF SUMMARY OF THE INVENTION

A detailed description is given in the following embodiments with reference to the accompanying drawings.

An embodiment of a circuitry of an IC is provided, comprising a pad, an internal circuit, and an ESD protection circuit. The pad transmits or receives a signal and is coupled to a first node. The internal circuit is coupled to the first node for processing the signal. The ESD protection circuit includes an ESD clamping circuit, a first current limiting and shunting unit and a second current limiting and shunting unit. The ESD clamping circuit is coupled to the first node, for clamping an ESD current flowing through the first node. The first current limiting and shunting unit is through the first node coupled to the pad, for limiting the ESD current and shunting part of the ESD current to a first voltage path. The second current limiting and shunting unit is coupled to the first current limiting and shunting unit, for limiting the ESD current and shunting part of the ESD current to a second voltage path.

Another embodiment of an ESD protection circuit for protecting an internal circuit from being damaged by an ESD current is provided. The ESD protection circuit comprises a first diffusion resistor and a second diffusion resistor. The first diffusion resistor is coupled to a pad and the internal circuit, for limiting the ESD current and shunting part of the ESD current to a first voltage path. The second diffusion resistor is coupled to the first diffusion resistor, for limiting the ESD current and shunting part of the ESD current to a second voltage path, wherein when the first diffusion resistor is N-type, the second diffusion resistor has a type different from the N-type, and when the first diffusion resistor is P-type, the second diffusion resistor has a type different from the P-type.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
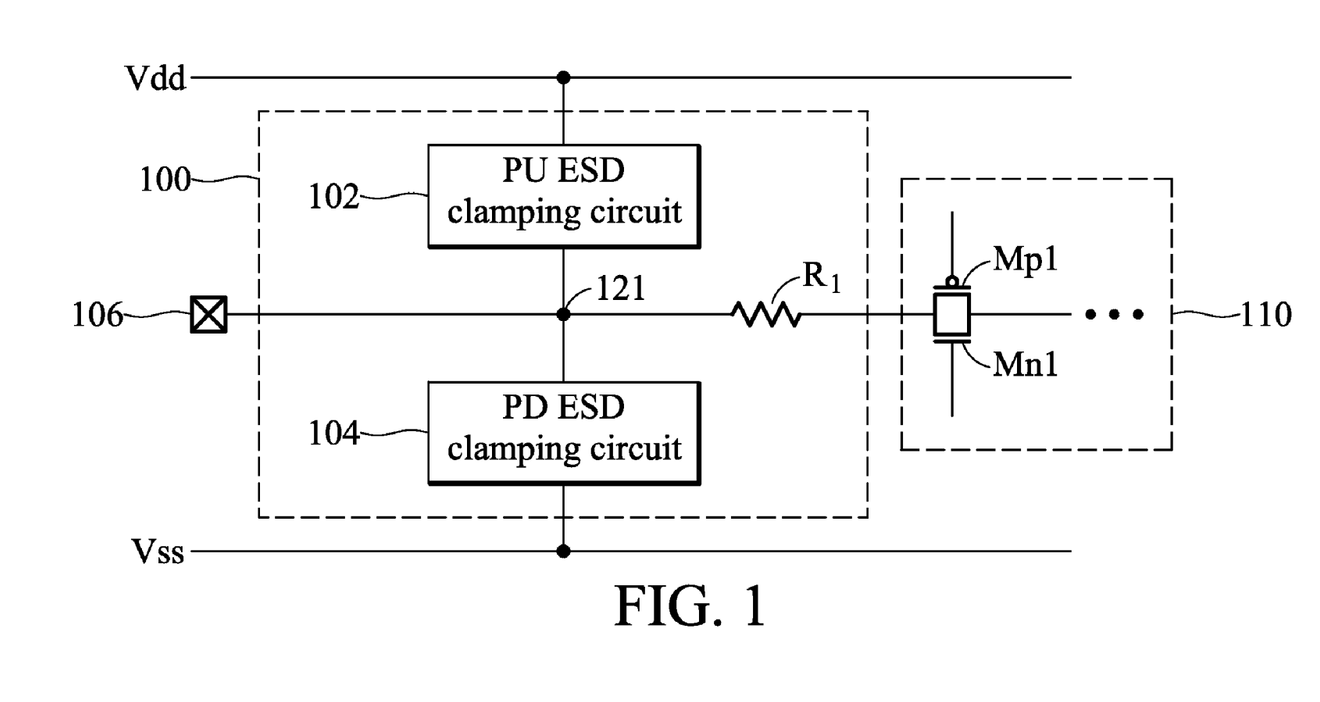
FIG. 1 is an ESD protection circuit.

FIG. 1 is a diagram of a circuitry of an IC having an ESD protection circuit 100 which blocks ESD from an I/O pad 106 to an internal circuit 110. The ESD protection 100 comprises a pull up (PU) ESD clamping circuit 102, a pull down (PD) ESD clamping circuit 104, and a resistor R1. The I/O pad 106 is coupled to a node 121 for receiving or transmitting a signal. The pull up ESD clamping circuit 102 is coupled between a first voltage path (Vdd) and the node 121 for clamping ESD signal under voltage level Vdd. The pull down ESD clamping circuit 104 is coupled between the node 121 and a second voltage path (Vss) for clamping the ESD signal above voltage level Vss. If the transmission gates Mn1 and Mp1 of the internal circuit 110 are not large enough to sustain the current flowing through drains thereof under ESD stress, damage at the transmission gates Mn1 and Mp1 may occur. The resistor R1, a current-limiting resistor, can reduce the ESD current to prevent damage of the internal circuit 110. Due to resistor R1, the current through the transmission gates Mn1 and Mp1 is largely reduced and internal circuit damage is prevented. However, exorbitantly large resistor may degrade the signal bandwidth or distort the signal substantially.

Figure 2:
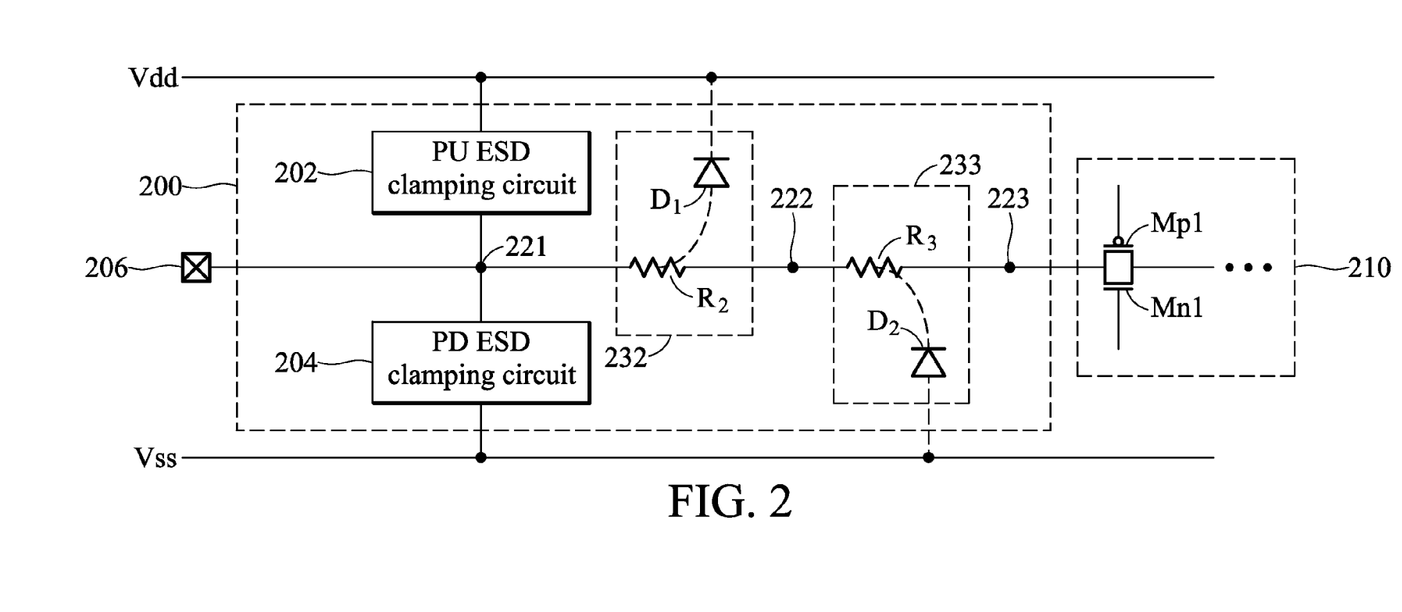
FIG. 2 is an ESD protection circuit according to an embodiment of the invention.

FIG. 2 shows another ESD protection circuit 200 implemented between an I/O pad 206 and an internal circuit 210 according to an embodiment of the invention. The ESD protection circuit 200 comprises a pull up ESD clamping circuit 202, a pull down ESD clamping circuit 204, and limiting and shunting units 232 and 233. The I/O pad 206 is coupled to a node 221 for receiving or transmitting a signal. The pull up ESD clamping circuit 202 is the same as the pull up ESD clamping circuit 102 and the pull down ESD clamping circuit 204 is the same as the pull down ESD clamping circuit 104. The first limiting and shunting units 232 is through the node 221 coupled to the I/O pad 206, and limits the ESD current and shunting part of the ESD current from flowing into the internal circuit 210; for example, the ESD current can be shunted to the first voltage path (Vdd). The first current limiting and shunting unit 232 comprises a diffusion resistor R2 for limiting the ESD current and a parasitic diode D1 for shunting part of the ESD current to the first voltage path (Vdd), as shown in FIG. 2. The second limiting and shunting units 233 is coupled to the first current limiting and shunting unit 232 in serial, and limits the ESD current and shunts part of the ESD current from flowing into the internal circuit 210; for example, the ESD current can be shunted to the second voltage path (Vss). The second current limiting and shunting unit 233 comprises a diffusion resistor R3 for limiting the ESD current and a parasitic diode D2 for shunting part of the ESD current to the second voltage path (Vss), as shown in FIG. 2. The diffusion resistor R2 and the diffusion resistor R3 are preferred to have different type, e.g. the diffusion resistor R2 is N-type and its N well is coupled to the voltage level VDD, and the diffusion resistor R3 is P-type and its P well is coupled to the voltage level VSS. Because the parasitic diodes D1 and D2 of the diffusion resistors R2 and R3 can shunt the ESD current, the resistance sum of diffusion resistors R2 and R3 is smaller than the resistance of resistor R1. Therefore, signal bandwidth will not be exorbitantly degraded and the signal will not be exorbitantly distorted. Moreover, layout of the diffusion resistors R2 and R3 can be separately fine-tuned to match the size of the internal circuit 210, and the internal ESD protection and layout area can thereby be optimized.

Figure 3:
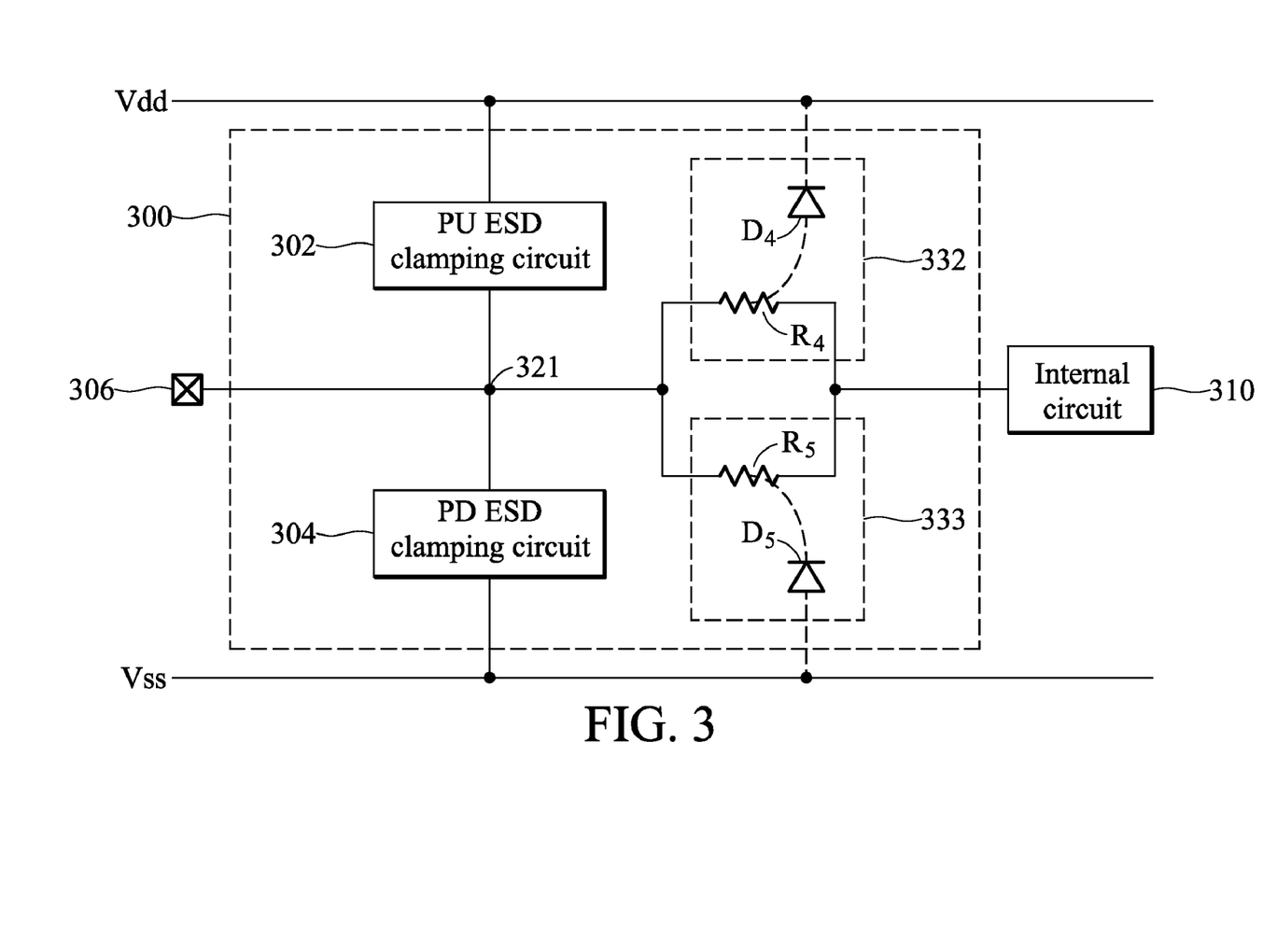
FIG. 3 is an ESD protection circuit according to another embodiment of the invention.

FIG. 3 is an ESD protection circuit 300 according to another embodiment of the invention. The ESD protection circuit 300 comprises a pull up ESD clamping circuit 302, a pull down ESD clamping circuit 304, and current limiting and shunting units 332 and 333. The ESD protection circuit 300 is similar to the ESD protection circuit 200. The difference is that the current limiting and shunting units are connected in serial or parallel. The first current limiting and shunting unit 332 comprises a diffusion resistor R4 for limiting the ESD current and a parasitic diode D4 for shunting part of the ESD current to the first voltage path (Vdd). The second current limiting and shunting unit 333 comprises a diffusion resistor R5 for limiting the ESD current and a parasitic diode D5 for shunting part of the ESD current to the second voltage path (Vss), as shown in FIG. 3.

Figure 4:
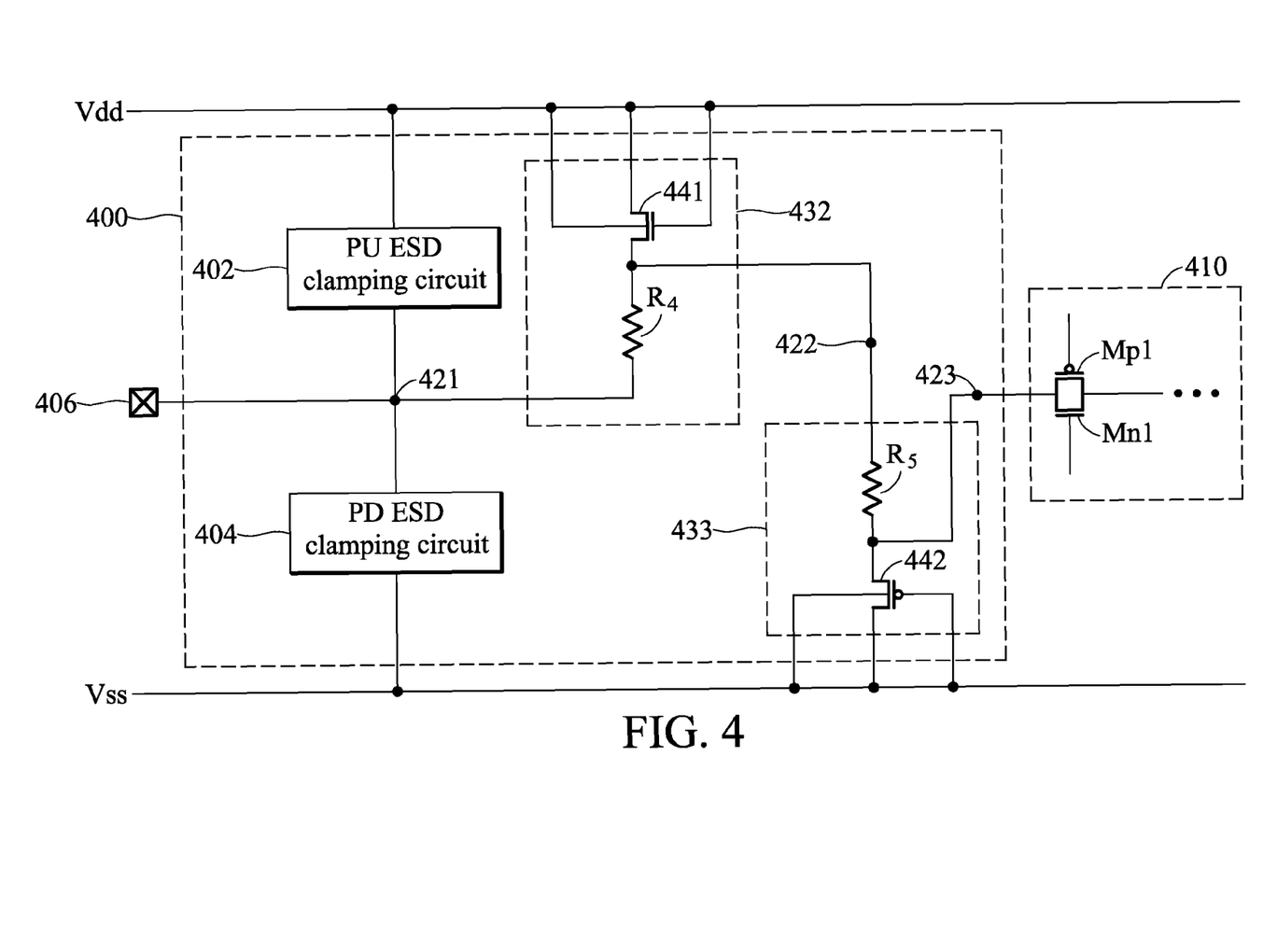
FIG. 4 is an ESD protection circuit according to another embodiment of the invention.

FIG. 4 is an ESD protection circuit 400 according to another embodiment of the invention. The ESD protection circuit 400 comprises a pull up ESD clamping circuit 402, a pull down ESD clamping circuit 404, and current limiting and shunting units 432 and 433. The ESD protection circuit 400 of FIG. 4 is amended from the ESD protection circuit 200 of FIG. 2. The first current limiting and shunting unit 432 has similar functions to the resistor R2 and the parasitic diode D1, and the second current limiting and shunting unit 433 also has similar functions to the resistor R3 and the parasitic diode D2, as shown in FIG. 2. The first current limiting and shunting unit 432 is a specific NMOS transistor 441 and the drain terminal of the specific NMOS transistor 441 is configured to have increased impedance illustrated by resistor R4 in FIG. 4 to limit the ESD current. The second current limiting and shunting unit 433 is a specific PMOS transistor 442 and the drain terminal of the specific PMOS transistor 442 is configured to have increased impedance illustrated by resistor R5 in FIG. 4 to limit the ESD current. The specific NMOS and PMOS transistors are discussed later in FIG. 6.

Figure 5:
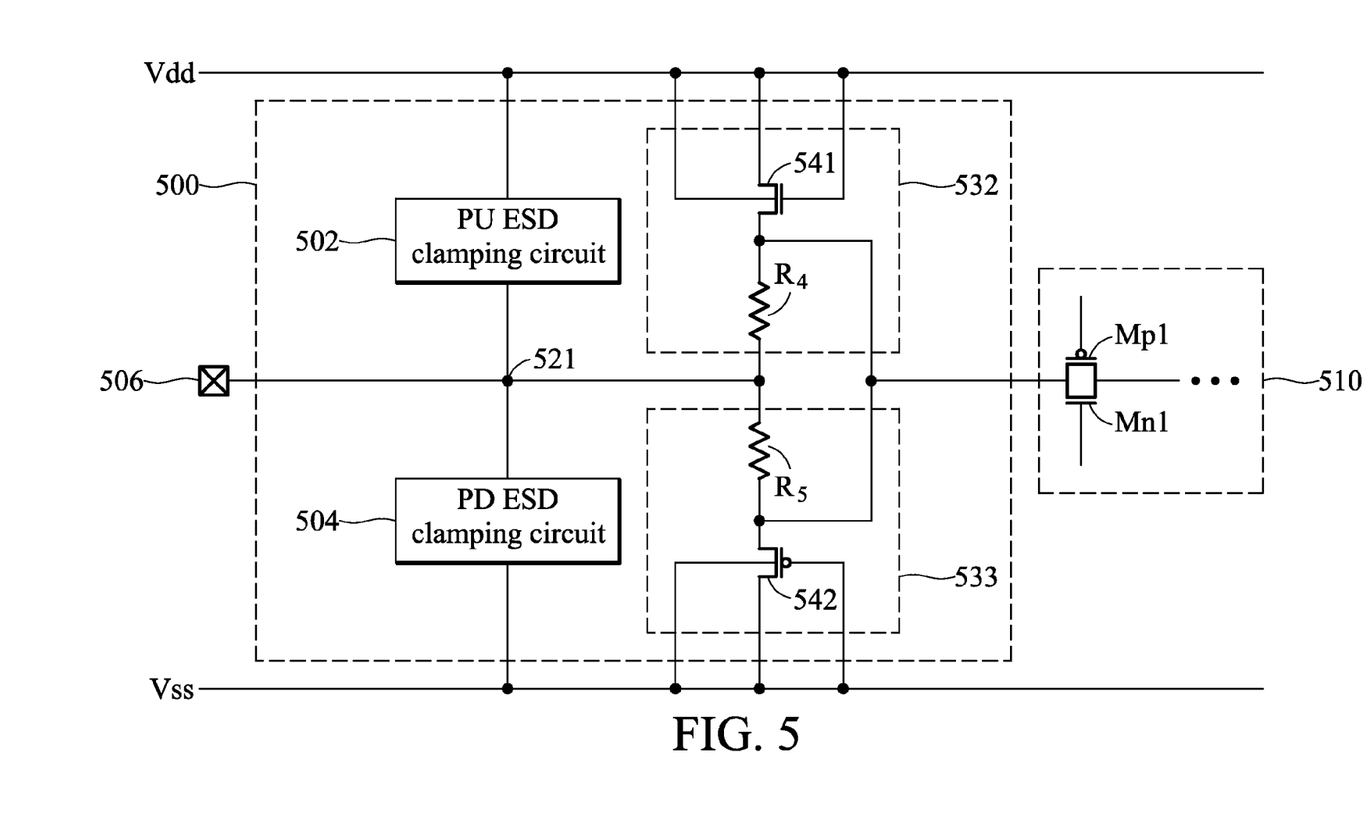
FIG. 5 is an ESD protection circuit according to another embodiment of the invention.

FIG. 5 is an ESD protection circuit 500 according to another embodiment of the invention. The ESD protection circuit 500 comprises a pull up ESD clamping circuit 502, a pull down ESD clamping circuit 504, and current limiting and shunting units 532 and 533. The ESD protection circuit 500 of FIG. 5 is amended from the ESD protection circuit 300 of FIG. 3. The first current limiting and shunting unit 532 has similar functions to the resistor R4 and the parasitic diode D4 and the second current limiting and shunting unit 533 also has similar functions to the resistor R5 and the parasitic diode D5, as shown in FIG. 3. The first current limiting and shunting unit 532 is a specific NMOS transistor 541 and the drain terminal of the specific NMOS transistor 541 is configured to have increased impedance illustrated by resistor R4 in FIG. 5 to limit the ESD current. The second current limiting and shunting unit 533 is a specific PMOS transistor 542 and the drain terminal of the specific PMOS transistor 542 is configured to have increased impedance illustrated by resistor R5 in FIG. 5 to limit the ESD current. The specific NMOS and PMOS transistors are discussed later in FIG. 6.

Figure 6:
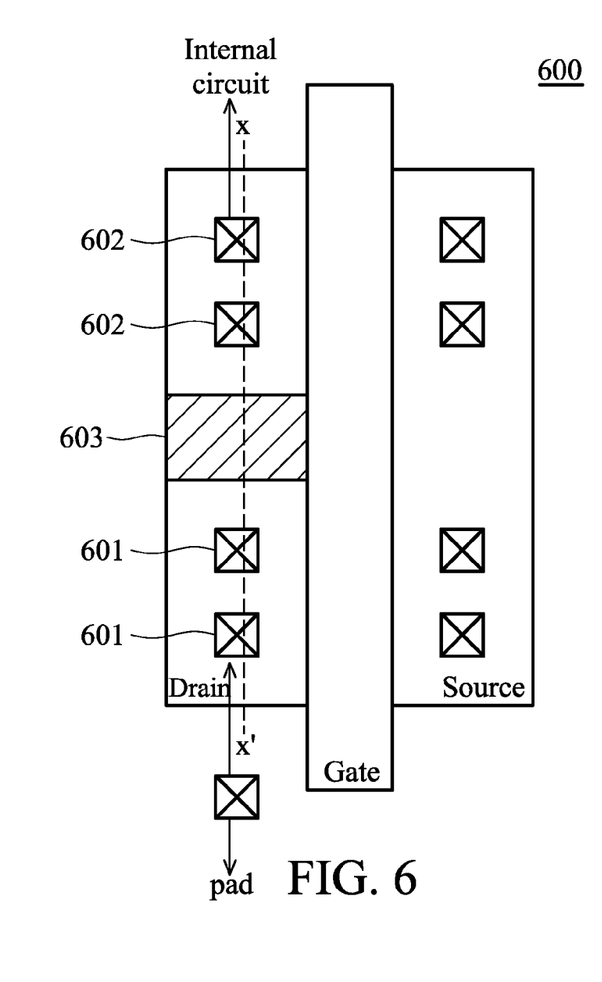
FIG. 6 is a specific MOS transistor according to another embodiment of the invention.

FIG. 6 is a specific MOS transistor 600 according to another embodiment of the invention. The MOS transistor 600 can be the current limiting and shunting units 432 and 433 of FIG. 4. The drain of the MOS transistor 600 comprises first contacts 601, second contacts 602 and a silicide block area 603. The silicide block area 603 is formed by masking silicide film during fabrication process or removing the silicide after the fabrication process. Since the silicide block area 603 has fewer or no conducting material, the resistance of the region increases. Using the current limiting and shunting unit 432 as an example, the contacts 601 are coupled to the first node 421. The contacts 602 are coupled to the second node 422. The silicide block area 603 is formed between the contacts 601 and 602 as the diffusion resistor R4 of FIG. 4. Similarly, using the current limiting and shunting unit 433 as an example, the contacts 601 are coupled to the second node 422. The contacts 602 are coupled to the third node 423. The silicide block area 603 is formed between the contacts 601 and 602 as the diffusion resistor R5 of FIG. 4. Similarly, The MOS transistor 600 can be the current limiting and shunting units 532 and 533 of FIG. 5.

Figure 7:
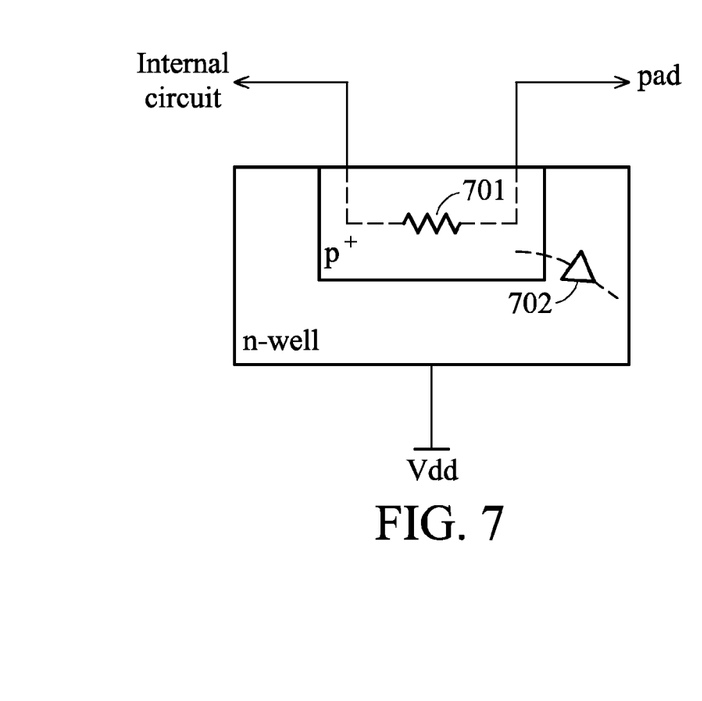
FIG. 7 is a cross section along X-X' line shown in FIG. 6 when the transistor of FIG. 6 is an NMOS transistor according to another embodiment of the invention.

FIG. 7 is a cross section along X-X' line shown in FIG. 6 when the transistor of FIG. 6 is an NMOS transistor according to another embodiment of the invention. As shown in FIG. 7, in this case, the transistor 600 is an NMOS transistor. A resistor 701 is generated by the silicide block area. The resistor 701 can be equivalent to the resistor R2 of FIG. 2 or the resistor R4 of FIG. 3. A diode 702 is formed between N Well and p+ area. The diode 702 can be equivalent to the diode D1 of FIG. 2 or the diode D4 of FIG. 3.

Figure 8:
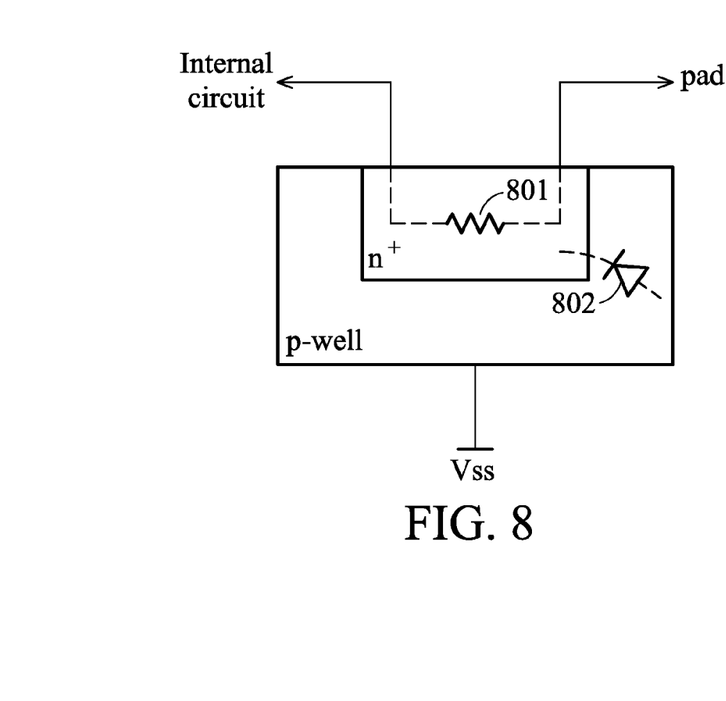
FIG. 8 is a cross section along X-X' line shown in FIG. 6 when the transistor of FIG. 6 is a PMOS transistor according to another embodiment of the invention.

FIG. 8 is a cross section along X-X' line shown in FIG. 6 when the transistor of FIG. 6 is a PMOS transistor according to another embodiment of the invention. As shown in FIG. 8, in this case, the transistor 600 is a PMOS transistor. A resistor 801 is generated by the silicide block area. The resistor 801 can be equivalent to the resistor R3 of FIG. 2 or the resistor R5 of FIG. 3. A diode 802 is formed between P Well and n+ area. The diode 802 can be equivalent to the diode D2 of FIG. 2 or the diode D5 of FIG. 3.

While the invention has been described by way of example and in terms of preferred embodiment, it is to be understood that the invention is not limited to thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An ESD protection circuit for protecting an internal circuit from being damaged by an ESD current, comprising a first MOS transistor coupled to a pad and the internal circuit, for limiting the ESD current and shunting part of the ESD current to a first voltage path; and a second MOS transistor coupled to the first MOS transistor, for limiting the ESD current and shunting part of the ESD current to a second voltage path;

wherein a drain of the first MOS transistor comprises first contacts coupled to a first node and second contacts coupled to a second node, and a first resistive area formed between the first contacts and the second contacts functions as a first diffusion resistor to increase impedance at the drain of the first MOS transistor, and a source of the first MOS transistor is coupled to the first voltage path, wherein a drain of the second MOS transistor comprises third contacts and fourth contacts, and a second resistive area formed between the third contacts and the fourth contacts functions as a second diffusion resistor to increase impedance at the drain of the second MOS transistor, and a source of the second MOS transistor is coupled to the second voltage path, and wherein when the first diffusion resistor is N-type, the second diffusion resistor has a type different from the N-type, and when the first diffusion resistor is P-type, the second diffusion resistor has a type different from the P-type.

2. The ESD protection circuit as claimed in claim 1, wherein the first resistive area is formed by blocking silicide film during fabrication process of the first MOS transistor.

3. The ESD protection circuit as claimed in claim 1, wherein the first resistive area is formed by removing silicide thereon after fabrication process of the first MOS transistor.

4. The ESD protection circuit as claimed in claim 1, wherein the third contacts are coupled to the second node and the fourth contacts are coupled to a third node.

5. The ESD protection circuit as claimed in claim 1, wherein the third contacts are coupled to the second node and the fourth contacts are coupled to the first node.

6. The ESD protection circuit as claimed in claim 1, wherein the first diffusion resistor and the second diffusion resistor are coupled in serial, the first diffusion resistor is coupled between the pad and a first node and the second diffusion resistor is coupled between the first node and the internal circuit.

7. The ESD protection circuit as claimed in claim 1, wherein the first diffusion resistor and the second diffusion resistor are coupled in parallel and between the pad and the internal circuit.

8. The ESD protection circuit as claimed in claim 1, wherein a gate of the first MOS transistor is coupled to the first voltage path.

9. The ESD protection circuit as claimed in claim 1, wherein a bulk of the first MOS transistor is coupled to the first voltage path.

* * * * *